United States Patent
Joseph et al.

(10) Patent No.: US 10,535,529 B2
(45) Date of Patent: Jan. 14, 2020

(54) SEMICONDUCTOR FIN LENGTH VARIABILITY CONTROL

(71) Applicant: International Business Machines Corporation, Armonk, NY (US)

(72) Inventors: Praveen Joseph, Albany, NY (US); Ekmini A. De Silva, Slingerlands, NY (US); Stuart A. Sieg, Albany, NY (US); Eric Miller, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/000,485

(22) Filed: Jun. 5, 2018

(65) Prior Publication Data
US 2019/0371613 A1  Dec. 5, 2019

(51) Int. Cl.
| H01L 29/80 | (2006.01) |
| H01L 21/308 | (2006.01) |
| H01L 21/8234 | (2006.01) |
| H01L 29/78 | (2006.01) |
| H01L 29/66 | (2006.01) |

(52) U.S. Cl.
CPC ...... *H01L 21/3086* (2013.01); *H01L 21/3081* (2013.01); *H01L 21/823431* (2013.01); *H01L 29/66795* (2013.01); *H01L 29/785* (2013.01)

(58) Field of Classification Search
CPC ......... H01L 21/3081; H01L 21/823431; H01L 29/66795; H01L 29/785
See application file for complete search history.

(56) References Cited

U.S. PATENT DOCUMENTS

| 8,003,466 B2 | 8/2011 | Shi et al. |
| 8,629,040 B2 * | 1/2014 | Chang ............... H01L 21/02639 438/429 |
| 8,846,490 B1 | 9/2014 | Shieh et al. |
| 9,412,818 B2 | 8/2016 | Yang et al. |

(Continued)

OTHER PUBLICATIONS

Borah et al., "Plasma etch technologies for the development of ultra-small feature size transistor devices," Journal of Physics D: Applied Physics, 44(17), 174012 (2011) (26 pages).

(Continued)

*Primary Examiner* — Samuel A Gebremariam
(74) *Attorney, Agent, or Firm* — Vazken Alexanian; Michael J. Chang, LLC (57) ABSTRACT

Techniques for fin length variability control are provided. In one aspect, a method of patterning fins in a wafer includes: depositing a hardmask and a tone invert layer on the wafer; patterning trenches in the tone invert layer; forming inverse tone etch masks on the hardmask within the trenches, wherein the inverse tone etch masks include inner and outer inverse tone etch masks; forming a save mask with opposite ends thereof aligned with the outer inverse tone etch masks; using the save mask to selectively remove unmasked portions of the tone invert layer; removing the outer inverse tone etch masks, wherein the inner inverse tone etch masks that remain have a uniform length L; patterning the hardmask into individual fin hardmasks using the inner inverse tone etch masks; and patterning fins in the wafer using the fin hardmasks. A device having fins of a uniform length L is also provided.

17 Claims, 10 Drawing Sheets

(56) References Cited

U.S. PATENT DOCUMENTS

| | | |
|---|---|---|
| 9,425,278 B2 | 8/2016 | Mieno |
| 9,716,091 B2 | 7/2017 | Lin et al. |
| 9,747,408 B2 | 8/2017 | Huang et al. |
| 2017/0243955 A1 | 8/2017 | Shinohara |
| 2017/0263438 A1 | 9/2017 | Li et al. |
| 2017/0358645 A1 | 12/2017 | Dewey et al. |

OTHER PUBLICATIONS

Natzle et al., "Trimming of hard-masks by gaseous Chemical Oxide Removal (COR) for sub-10 nm gates/fins, for gate length control and for embedded logic," Advanced Semiconductor Manufacturing, 2004. ASMC'04. IEEE Conference and Workshop (pp. 61-65). IEEE. (May 2004).

Mameli et al., "Area-Selective Atomic Layer Deposition of SiO2 Using Acetylacetone as a Chemoselective Inhibitor in an ABC-Type Cycle," ACS Nano, 11, pp. 9303-9311 (Aug. 2017).

Yim et al., "Nucleation kinetics of Ru on silicon oxide and silicon nitride surfaces deposited by atomic layer deposition," Journal of Applied Physics 103, 113509 (Jun. 2008) (9 pages).

Singh et al., "Area-Selective Atomic Layer Deposition of Metal Oxides on Noble Metals through Catalytic Oxygen Activation," Chem. Mater. 2018, 30, pp. 663-670 (published Dec. 2017).

Ooba et al., "Self-Limiting Atomic-Layer Selective Deposition of Silicon Nitride by Temperature-Controlled Method," Extended Abstracts of the 1998 International Conference on Solid State Devices and Materials, Sep. 1998, pp. 22-23.

\* cited by examiner

SEMICONDUCTOR FIN LENGTH VARIABILITY CONTROL

FIELD OF THE INVENTION

The present invention relates to semiconductor fin patterning, and more particularly, to techniques for semiconductor fin length variability control.

BACKGROUND OF THE INVENTION

Semiconductor fins are currently patterned using lithography. The lengths of the fins are defined using a cut or 'save' lithography step in the orthogonal direction.

At tight fin pitches, however, the corner rounding of the save pattern causes fin length variability. Fin length variability affects the effective circumference of the fin that undesirably leads to varying device performance fin-to-fin. Further, any mis-alignment or overlay errors of the save pattern with respect to the fin pattern can result in sliver defects, i.e., the unintentional save of fin that was not meant to be saved.

Therefore, techniques that reduce fin length variability that arises due to corner rounding and sliver defects that arise due to alignment and overlay errors would be desirable.

SUMMARY OF THE INVENTION

The present invention provides techniques for semiconductor fin length variability control. In one aspect of the invention, a method of patterning fins in a wafer is provided. The method includes: depositing a hardmask on the wafer; depositing a tone invert layer on the hardmask; patterning trenches in the tone invert layer; forming inverse tone etch masks on the hardmask within the trenches patterned in the tone invert layer, wherein the inverse tone etch masks include inner inverse tone etch masks between two outer inverse tone etch masks; forming a save mask on the tone invert layer with opposite ends of the save mask being aligned with the outer inverse tone etch masks; using the save mask to selectively remove unmasked portions of the tone invert layer to expose the outer inverse tone etch masks; removing the outer inverse tone etch masks, wherein the inner inverse tone etch masks that remain have a uniform length L; patterning the hardmask into a plurality of individual fin hardmasks using the inner inverse tone etch masks; and patterning a plurality of fins in the wafer using the plurality of individual fin hardmasks.

In another aspect of the invention, a device is provided. The device includes: fins patterned in a wafer, wherein the fins have a uniform length L; a gate disposed over a portion of the fins that serves as a channel region of the device; source and drain regions disposed over portions of the fins extending out from under the gate; and spacers offsetting the gate from the source and drains.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for reducing fin length variability and slivers due to corner rounding using an inverse tone lithography process combined with an isotropic fin etch component. As described above, semiconductor fins typically are patterned using lithography, followed by a cut or 'save' lithography step in the orthogonal direction to define the fin length. Corner rounding in the save pattern can, however, result in fin length variability and slivers. See, for example, FIG. 1.

Figure 1:
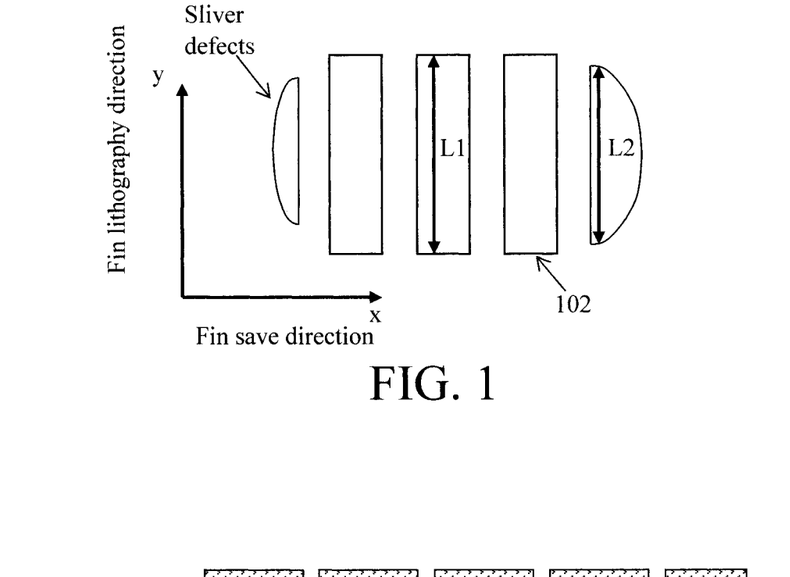
FIG. 1 is a diagram illustrating a plurality of fins after a fin lithography has been performed, followed by a fin save which results in fin length variation and sliver formation.

What is shown in FIG. 1 is a plurality of fins 102 after a fin lithography (along the y-direction) has been performed, followed by a fin save (along the x-direction) in accordance with a conventional process. Corner rounding during the fin cut results in fin length variations. For instance, the middle fins 102 have a length L1 whereas the end fins have a length L2, wherein L1>L2. As provided above, this fin length variability is undesirable as it leads to variation in device performance from fin-to-fin. Also, any misalignment of the save pattern (not shown) over the fins 102 (e.g., along the x-direction) can result in slivers of a fin unintentionally being left behind.

Advantageously, the present techniques avoid fin length variability and slivers using an inverse tone lithography process combined with an isotropic fin etch component which involves protecting more fins than are needed, and pushing the corner rounding to outside of those fins that are to be kept. An exemplary embodiment employing these techniques is now described by way of reference to FIGS. 2-19.

Figure 2:
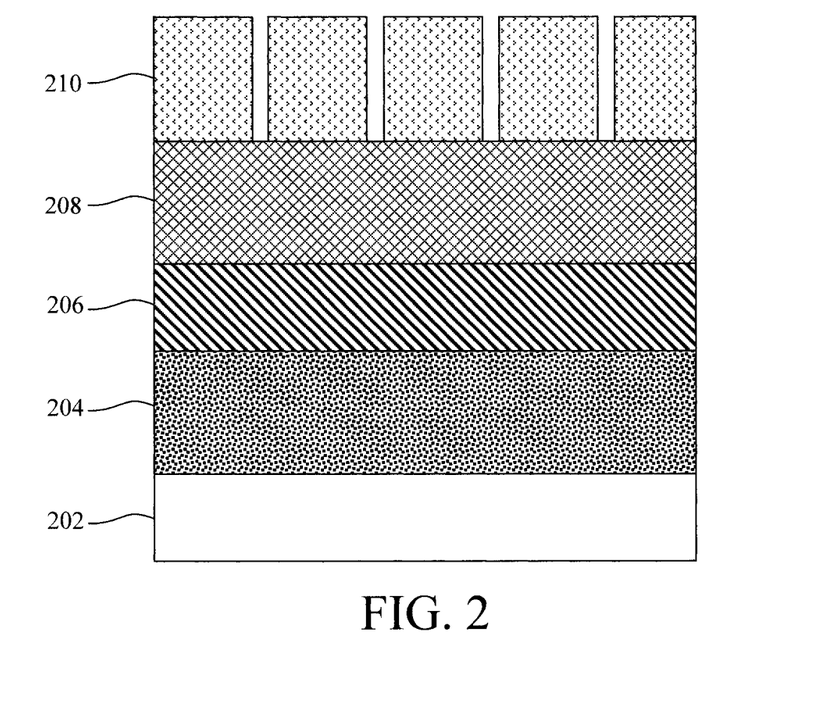
FIG. 2 is a cross-sectional diagram illustrating a hardmask having been deposited onto a wafer, a tone invert layer having been deposited onto the hardmask, followed by a lithography stack, and a patterned resist having been formed on the lithography stack according to an embodiment of the present invention.

As shown in FIG. 2, the process begins with a wafer 202 onto which a hardmask 204 is deposited. A tone invert layer 206 is deposited onto the hardmask 204, followed by a lithography stack 208. Finally, a patterned resist 210 is formed on the lithography stack 208.

According to an exemplary embodiment, wafer 202 is a bulk semiconductor wafer, such as a bulk silicon (Si), bulk germanium (Ge), bulk silicon germanium (SiGe) and/or bulk III-V semiconductor wafer. Alternatively, wafer 202 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

Suitable materials for the hardmask 204 include, but are not limited to, nitride hardmask materials such as silicon nitride (SiN) and/or silicon oxycarbonitride (SiOCN). For instance, according to an exemplary embodiment, the hardmask 204 is a nitride hardmask. Embodiments are also contemplated herein where the hardmask 204 includes an amorphous silicon (a-Si) layer on top of a nitride hardmask. According to an exemplary embodiment, the hardmask 204 has a thickness of from about 80 nanometers (nm) to about 150 nm and ranges therebetween. Processes such as chemical vapor deposition (CVD) or atomic layer deposition (ALD) can be used to deposit the hardmask materials.

Suitable materials for the tone invert layer 206 include, but are not limited to, oxide materials such as $SiO_2$ and/or SiOC. According to an exemplary embodiment, the tone invert layer 206 has a thickness of from about 50 nm to about 100 nm and ranges therebetween. Processes such as CVD or ALD can be used to deposit the tone invert layer 206.

A variety of configurations are contemplated herein for the lithography stack 208. For instance, in one exemplary embodiment the lithography stack 208 includes an organic planarizing layer (OPL) on the tone invert layer 206, and an antireflective coating (ARC) on the OPL, i.e., OPL/ARC. Embodiments are also contemplated herein where the lithography stack 208 simply includes an ARC under the patterned photoresist 210. According to an exemplary embodiment, the lithography stack 208 has a thickness of from about 30 nm to about 80 nm and ranges therebetween. Processes such as CVD or ALD can be used to deposit the lithography stack material(s).

To form the patterned resist 210 on the lithography stack 208, a resist material is deposited onto the lithography stack 208, and standard lithography and etching techniques are used to pattern the resist layer. Preferably, the resist is printed at the smallest possible space at a given pitch. Later, when the pattern is transferred to the tone invert layer 206, steps can (optionally) be taken to narrow the space if so desired.

Figure 3:
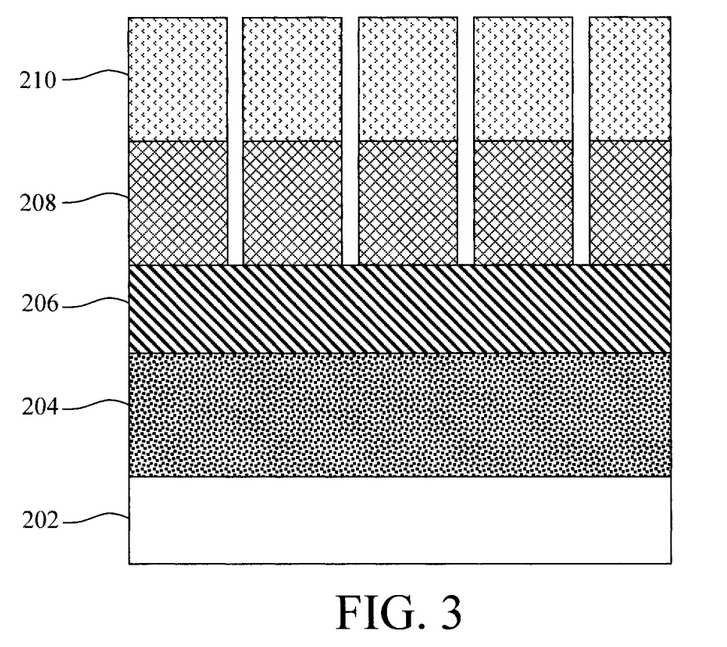
FIG. 3 is a cross-sectional diagram illustrating the pattern from the resist having been transferred to the lithography stack according to an embodiment of the present invention.

Next, as shown in FIG. 3, the pattern from the resist 210 is transferred to the lithography stack 208. According to an exemplary embodiment, the pattern is transferred to the lithography stack 208 using a directional (anisotropic) etching process such as reactive ion etching (RIE).

Figure 4:
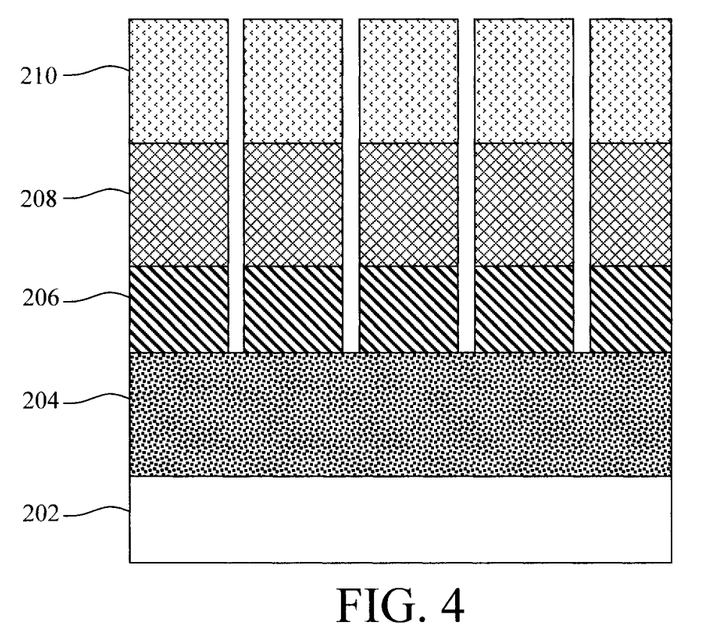
FIG. 4 is a cross-sectional diagram illustrating the pattern having been transferred to the tone invert layer according to an embodiment of the present invention.
Figure 5:
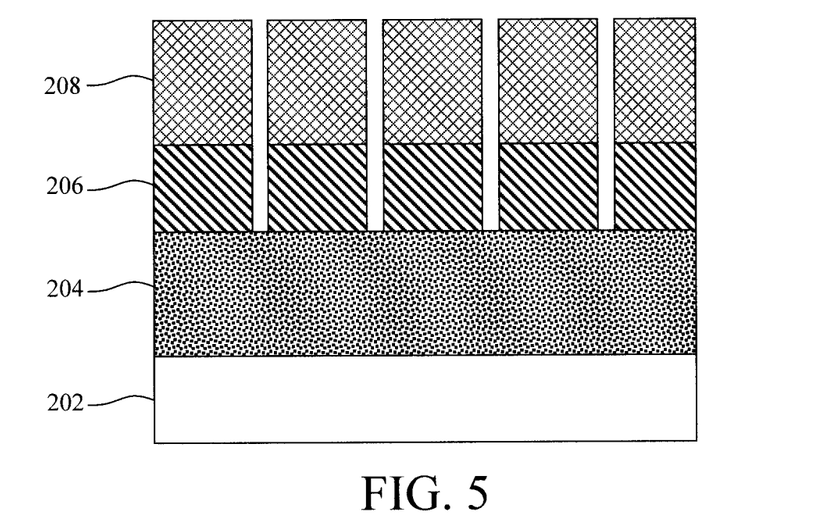
FIG. 5 is a cross-sectional diagram illustrating the resist having been removed according to an embodiment of the present invention.

The pattern is then transferred to the tone invert layer 206. See FIG. 4. As provided above, the tone invert layer 206 can be formed from an oxide material. In that case, a RIE process that etches oxide selective to the lithography stack can be employed to pattern the tone invert layer 206, stopping on the hardmask 204. Following patterning of the tone invert layer 206, any remaining resist 210 can be removed. See FIG. 5. Depending on the particular resist material being used, a standard wet and/or dry etching process can be used to clear the remaining resist 210 from the lithography stack 208.

The remaining lithography stack 208 is next removed. See FIG. 6. Again, a standard wet and/or dry etching process can be used to remove the lithography stack 208 from the tone invert layer 206.

Figure 6:
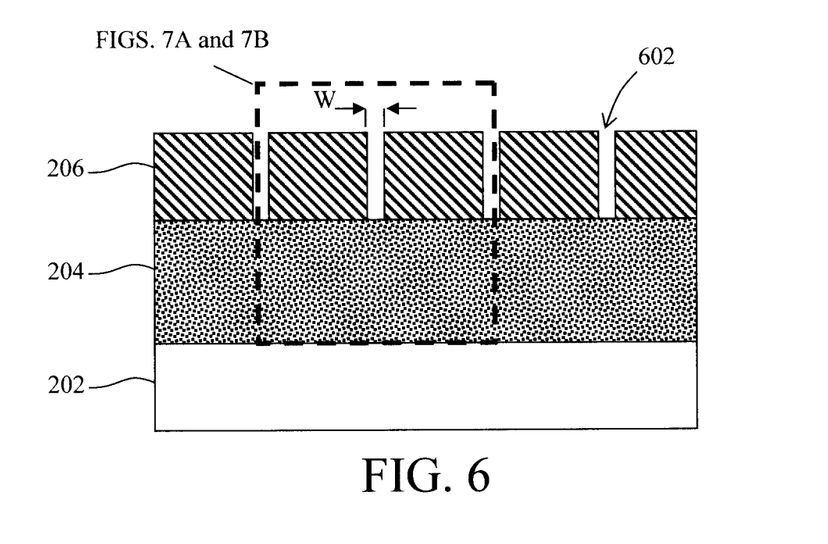
FIG. 6 is a cross-sectional diagram illustrating the lithography stack having been removed, and that the pattern present in the tone invert layer includes a plurality of trenches according to an embodiment of the present invention.

As shown in FIG. 6, the pattern now present in the tone invert layer 206 includes a plurality of trenches 602 patterned in the tone invert layer 206. These trenches 602 will later be filled with an inverse tone etch mask which will ultimately be used to pattern the fin hardmask and subsequently the fins. As also shown in FIG. 6, as patterned the trenches 602 have a width W which is based on the lithographically defined resist 210 (see above). According to an exemplary embodiment, W is from about 10 nm to about 20 nm and ranges therebetween. As provided above, the resist can be printed at the smallest possible space at a given pitch. However, if thinner fins are required for a given application, the width W can be narrowed (i.e., reduced to W', wherein W>W') as now described in conjunction with the description of FIG. 7A.

Figure 7A:
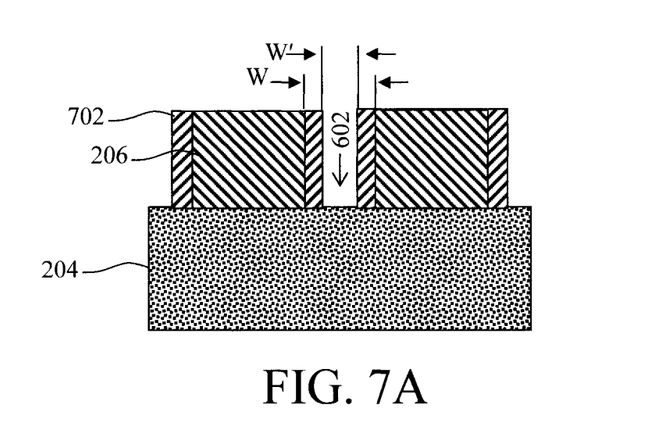
FIG. 7A is a cross-sectional diagram illustrating a magnified view of a portion of the structure of FIG. 6 wherein additional material, that is the same material as the tone invert layer, has (optionally) been formed on sidewalls of the trenches in the tone invert layer reducing the width of the trenches according to an embodiment of the present invention.

FIG. 7A depicts a magnified view of a portion of the structure (see dashed box in FIG. 6). To narrow the width in the trenches 602, additional tone invert material 702 can be deposited (conformally) onto the tone invert layer 206 (i.e., along the sidewalls of the trenches 602), and thereby reducing the width from W to W'. See FIG. 7A. According to an exemplary embodiment, W' is from about 2 nm to about 15 nm and ranges therebetween.

According to an exemplary embodiment, the tone invert material 702 used is the same material as the tone invert layer 206 (e.g., an oxide material such as $SiO_2$ and/or SiOC—see above). However, it is not required to use the same material for both tone invert layers. For instance, tone invert layer 206 can be formed from $SiO_2$ while the tone invert material 702 is SiOC, or vice versa.

In general, the goal is to place the tone invert material 702 selectively on the tone invert layer 206. Namely, one wants to narrow the trenches 602 from the sides, but not fully cover over the hardmask 204 at the bottom of the trenches 602. Several different approaches for accomplishing this are contemplated herein. For instance, as shown in methodology 800 of FIG. 8, in step 802 the tone invert material 702 is deposited using a conformal deposition process such as ALD over the tone invert layer 206 and on the surface of the exposed hardmask 204 at the bottom of the trenches 602. The thickness of the deposited tone invert material 702 depends on the desired amount to reduce the width W. So, for instance, if W is 15 nm and the required W' is 10 nm, then the thickness t of the tone invert material 702 is $t=(W-W')/2 \Rightarrow t=2.5$ nm.

Figure 8:
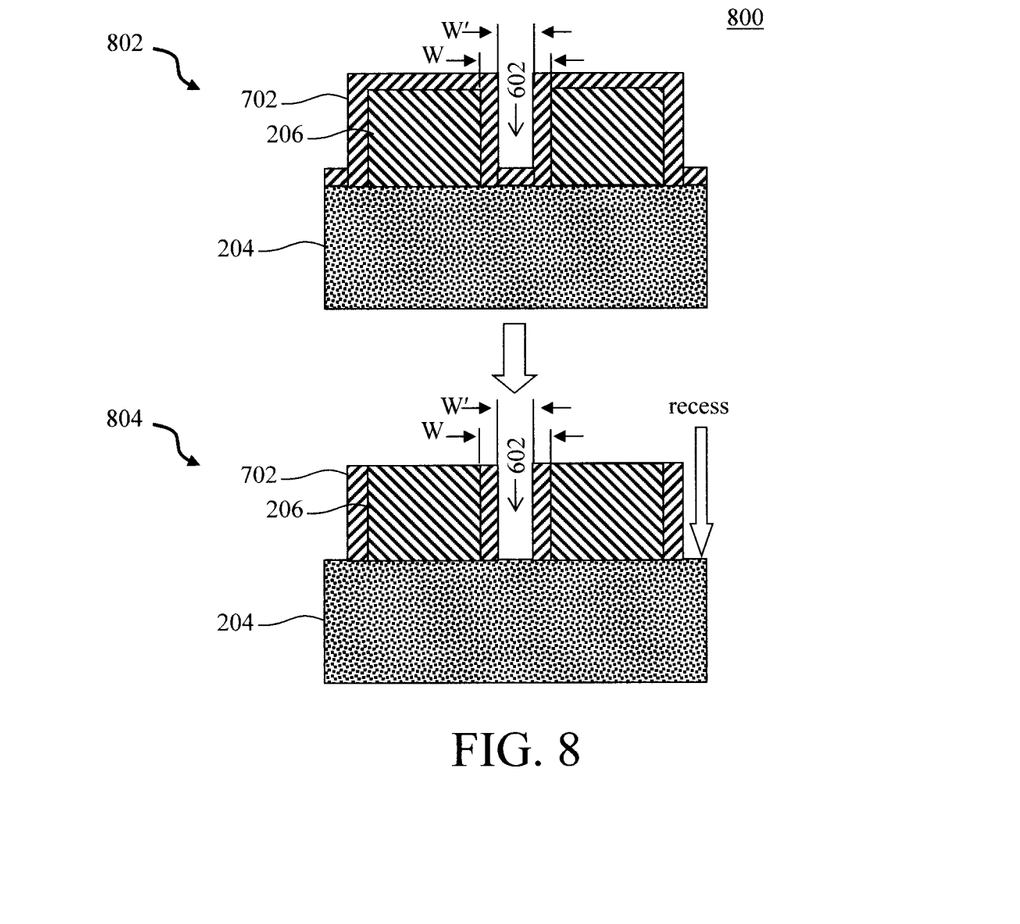
FIG. 8 is a diagram illustrating an exemplary methodology for depositing the additional material onto the tone invert layer according to an embodiment of the present invention.

In step 804, the deposited tone invert material 702 is then etched back to expose the underlying hardmask 204 in the trenches 602. A directional etching process such as RIE can be employed for the recess etch. As a result, the tone invert material 702 closes the width in the trenches 602 (i.e., from W to W') from the sides, while the hardmask 204 remains exposed at the bottoms of the trenches 602, forming the structure shown in FIG. 7A.

Figure 7B:
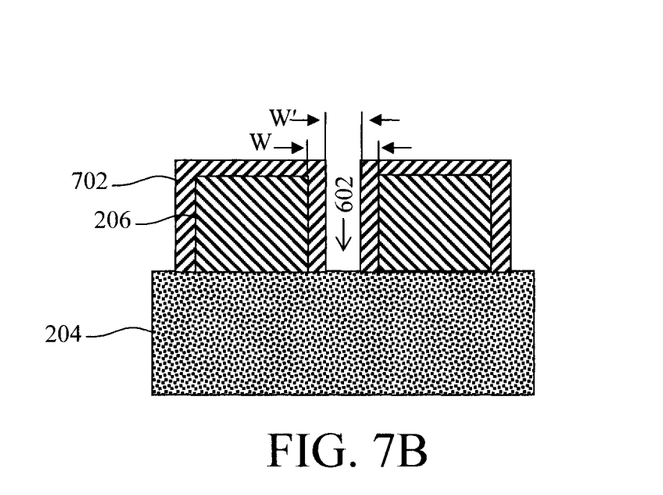
FIG. 7B is a cross-sectional diagram illustrating a magnified view of a portion of the structure of FIG. 6 wherein additional material, that is the same material as the tone invert layer, has (optionally) been selectively deposited on the tone invert layer reducing the width of the trenches according to an embodiment of the present invention.

In another approach, the tone invert material 702 is deposited selectively (e.g., using a conformal deposition process such as ALD) on the top and sidewalls of the tone invert layer 206, but not on the hardmask 204 at the bottom of the trenches 602. The result is the structure shown in FIG. 7B. According to an exemplary embodiment, the tone invert layer 206 and tone invert material 702 are both oxides and a selective process (for growth of oxide on oxide) is employed. See, for example, Mameli et al., "Area-Selective Atomic Layer Deposition of SiO2 Using Acetylacetone as a Chemoselective Inhibitor in an ABC-Type Cycle," ACS Nano, 11, pgs. 9303-9311 (August 2017), the contents of which are incorporated by reference as if fully set forth herein.

In the figures that follow, the use of additional tone invert material 702 along the sidewalls of the trenches 602 is not specifically highlighted. However, it is to be understood that this optional step to narrow the trenches 602 can be performed, if so desired, such that the trenches 602 from this point on in the process flow will have a reduced width W'.

Next, inverse tone etch masks 902 are formed in the trenches 602. See FIG. 9. There are several requirements for the inverse tone etch masks 902. First, the inverse tone etch masks 902 should have deposition or growth selectivity to the tone invert layer 206, meaning that growth/deposition of the material used to form the inverse tone etch masks 902 should be selective to exposed surfaces of the hardmask 204 at the bottoms of the trenches 602, as opposed to on the tone invert layer. That way, the inverse tone etch masks 902 can be formed in the trenches 602 without worrying about voids. For instance, voids may occur when growth/deposition occurs on all surfaces of the trenches rather than just up from the bottom due to pinching off of the trenches prior to them being filled. Second, the inverse tone etch masks 902 should have etch selectivity to the hardmask 204. Namely, the inverse tone etch masks 902 will be used to pattern the hardmask 204 into a plurality of individual fin hardmasks (see below). Third, the inverse tone etch masks 902 should be removable by an isotropic (i.e., non-directional) etching process such as a wet etch. As will be described in detail below, following patterning of a save mask (for a fin cut in the horizontal direction), an etch will be used to remove the exposed inverse tone etch masks 902. The etch will have an isotropic component to access (and remove) the inverse tone etch masks 902 just under the outer edges of the save mask which otherwise would undesirably have a decreased length due to corner rounding in the save mask.

Figure 9:
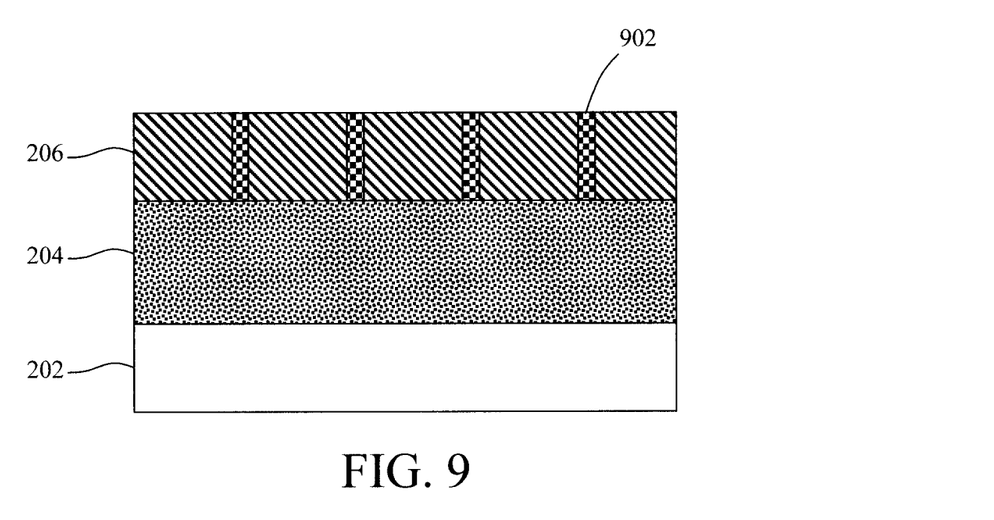
FIG. 9 is a cross-sectional diagram illustrating inverse tone etch masks having been formed in the trenches according to an embodiment of the present invention.

By way of example only, suitable materials for the inverse tone etch masks 902 include, but are not limited to, nitride materials such as SiN and/or SiOCN and/or metal oxides such as titanium dioxide ($TiO_2$) and/or ruthenium oxide ($RuO_2$). Further, it is notable that a greater number of the inverse tone etch masks 902 are formed than will be used for fin patterning, since the outer inverse tone etch masks 902 will be removed (prior to fin etching) to eliminate any length variation due to corner rounding in the save mask used to define the fin length.

According to one exemplary embodiment, the inverse tone etch masks 902 are grown in the trenches 602 using a selective bottom-up gap-fill process whereby the inverse tone etch masks 902 are grown up from the exposed hardmask 204 at the bottom of the trenches 602. For instance, as provided above, the hardmask 204 can be a nitride hardmask. In that case, steps can be taken to enhance growth of a metal oxide material for the inverse tone etch masks 902 on the nitride surfaces of the hardmask 204 as compared to on the oxide surfaces of the tone invert layer 206.

For instance, a chemical oxide removal (COR)/Siconi™ dry chemical etch-type preclean can be used to form hydroxyl groups on the oxide surfaces of the tone invert layer 206 (which will also remove native oxides from the nitride surfaces of the hardmask 204), followed by hexamethyldisilazane (HMDS)/self-assembled monolayer (SAM) treatment to form a hydrophobic surface. The nitride surfaces of the hardmask 204 will react much slower to this HMDS/SAM treatment, which in turn will decrease the metal precursor adsorption sites for the oxide surfaces of the tone invert layer 206 and enable selective growth of metal oxide inverse tone etch masks 902 on the nitride surfaces of the hardmask 204. Suitable techniques for enhancing growth of metals on nitride substrates are also described, for example, in Yim et al., "Nucleation kinetics of Ru on silicon oxide and silicon nitride surfaces deposited by atomic layer deposition," Journal of Applied Physics 103, 113509 (June 2008), the contents of which are incorporated by reference as if fully set forth herein.

Figure 10:
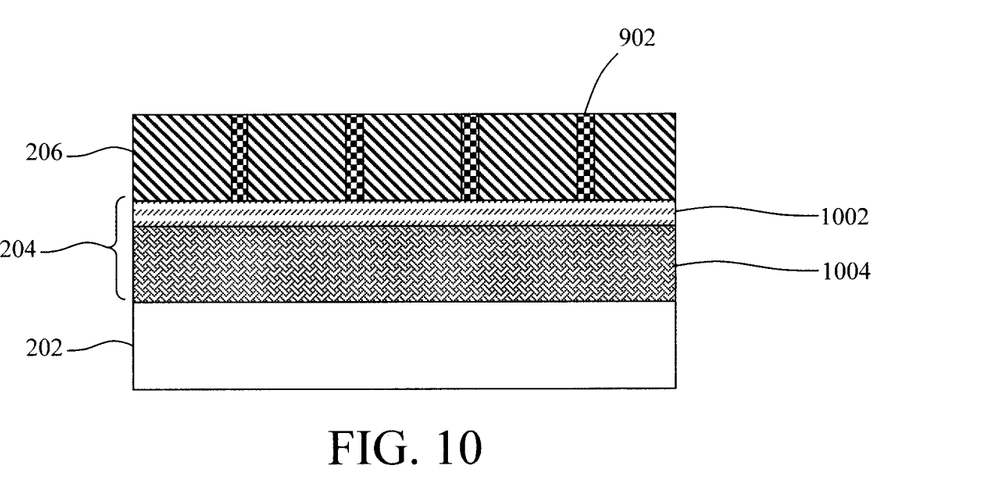
FIG. 10 is a cross-sectional diagram illustrating an exemplary configuration of the hardmask having an amorphous silicon layer on top of a nitride hardmask according to an embodiment of the present invention.

A process for selectively growing nitride inverse tone etch masks 902 on the hardmask 204 when the hardmask 204 includes an a-Si layer on a nitride hardmask (see above) may also be employed. See, for example, FIG. 10 wherein an exemplary of the hardmask 204 is shown having an a-Si layer 1002 on top of a nitride hardmask 1004. Techniques for selectively depositing a nitride material on a silicon surface are described, for example, in U.S. Patent Application Publication Number 2017/0263438 by Li et al., entitled "Methods and apparatus for Selective Dry Etch" (hereinafter "U.S. Patent Application Publication Number 2017/0263438"), the contents of which are incorporated by reference as if fully set forth herein. For instance, according to U.S. Patent Application Publication Number 2017/0263438 a SiN film is selectively formed on a Si substrate by exposure first to a silicon precursor that reacts with the substrate surface, followed by a nitrogen reactant that reacts with the silicon molecules on the substrate surface).

According to another exemplary embodiment, the inverse tone etch masks 902 are deposited in the trenches 602 using induced material selectivity, whereby a surface treatment of the hardmask 204 is performed (prior to depositing the tone invert layer 206 on the hardmask 204) such that deposition of the material for the inverse tone etch masks 902 occurs selectively on the treated surface. For instance, surface treatments with noble metals such as platinum can be used for area-selective ALD of metal oxides via oxygen dissociation of the noble metal surfaces. See, for example, Singh et al., "Area-Selective Atomic Layer Deposition of Metal Oxides on Noble Metals through Catalytic Oxygen Activation," Chem. Mater. 2018, 30, pgs. 663-670 (published December 2017), the contents of which are incorporated by reference as if fully set forth herein.

Further, the hardmask 204 material may itself have an inherent selectivity for deposition of the inverse tone etch masks 902. For instance, by controlling the temperature of an ALD process, selective deposition of nitride inverse tone etch masks 902 on a-Si surfaces of the hardmask 204 can be achieved over the oxide surfaces of the tone invert layer 206. See, for example, Ooba et al., "Self-Limiting Atomic-Layer Selective Deposition of Silicon Nitride by Temperature-Controlled Method," Extended Abstracts of the 1998 International Conference on Solid State Devices and Materials, September 1998, pp. 22-23, the contents of which are incorporated by reference as if fully set forth herein.

A (second) lithography stack 1102 is then deposited on the tone invert layer 206/inverse tone etch masks 902, and a patterned resist 1104 is formed on the lithography stack 1102. See FIG. 11. This lithography stack 1102 and patterned resist 1104 will be used to pattern a save mask marking the location of the save to be performed in the orthogonal direction to define the fin length. As above, the lithography stack 1102 can have a variety of different configurations. For instance, in one exemplary embodiment, the lithography stack 1102 includes an OPL on the tone invert layer 206/inverse tone etch masks 902, and an ARC on the OPL, i.e., OPL/ARC. Embodiments are also contemplated herein where the lithography stack 1102 simply includes an ARC under the patterned resist 1104.

Figure 11:
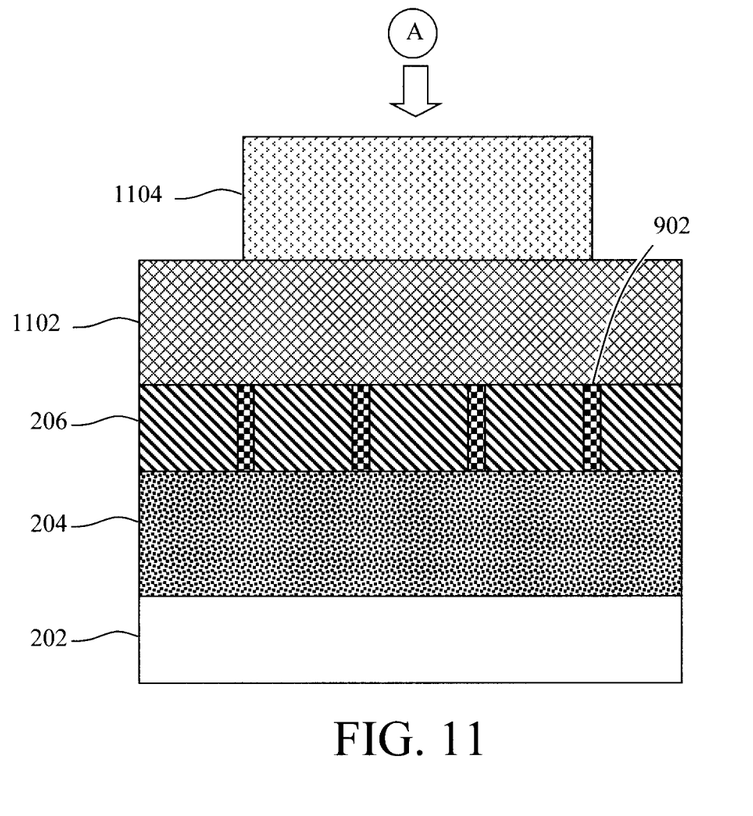
FIG. 11 is a cross-sectional diagram illustrating a (second) lithography stack having been deposited on the tone invert layer/inverse tone etch masks, and a patterned resist having been formed on the lithography stack according to an embodiment of the present invention.

As provided above, standard lithography and etching techniques can be used to form the patterned resist 1104 on the lithography stack 1102. The patterned resist 1104 marks the footprint and location of the save mask. Notably, the ends of the save mask will align with the outer inverse tone etch masks 902. As will be described in detail below, this configuration will enable selective removal of the tone invert layer 206 outside of the save mask, followed by selective removal (via an isotropic etch) of the outer inverse tone etch masks 902 in order to prevent fin length variability due to corner rounding of the save mask.

Figure 12:
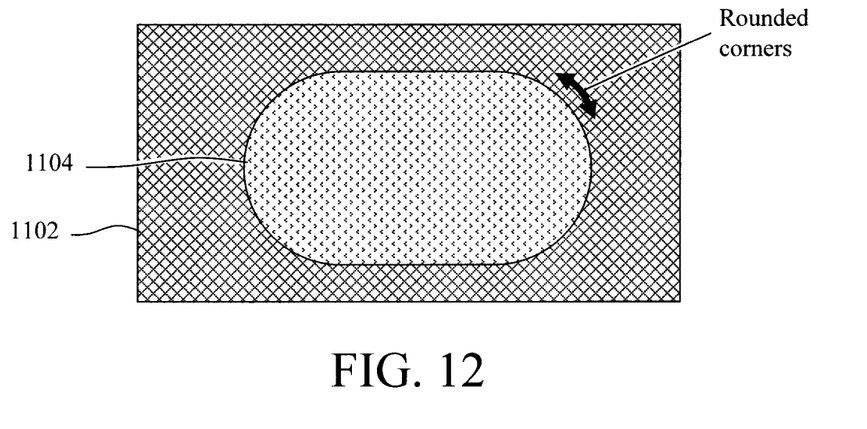
FIG. 12 is a top-down diagram illustrating how the patterned resist has rounded corners according to an embodiment of the present invention.

Namely, switching to a top-down view (e.g., from viewpoint A—see FIG. 11), as shown in FIG. 12 the patterned resist 1104 will have rounded corners since the lithography and etching used to pattern the resist 1104 cannot produce sharp corners. Once that pattern is transferred to the lithography stack 1102 and then onto the underlying inverse tone etch masks 902, the outer inverse tone etch masks 902 under the rounded corners would undesirably be cut to a shorter length due to the rounding. However, the present techniques advantageously employ an isotropic etch to remove those outer inverse tone etch masks 902 preventing length variability when the inverse tone etch mask pattern is transferred to the hardmask 204 and then onto the underlying wafer 202.

Figure 13:
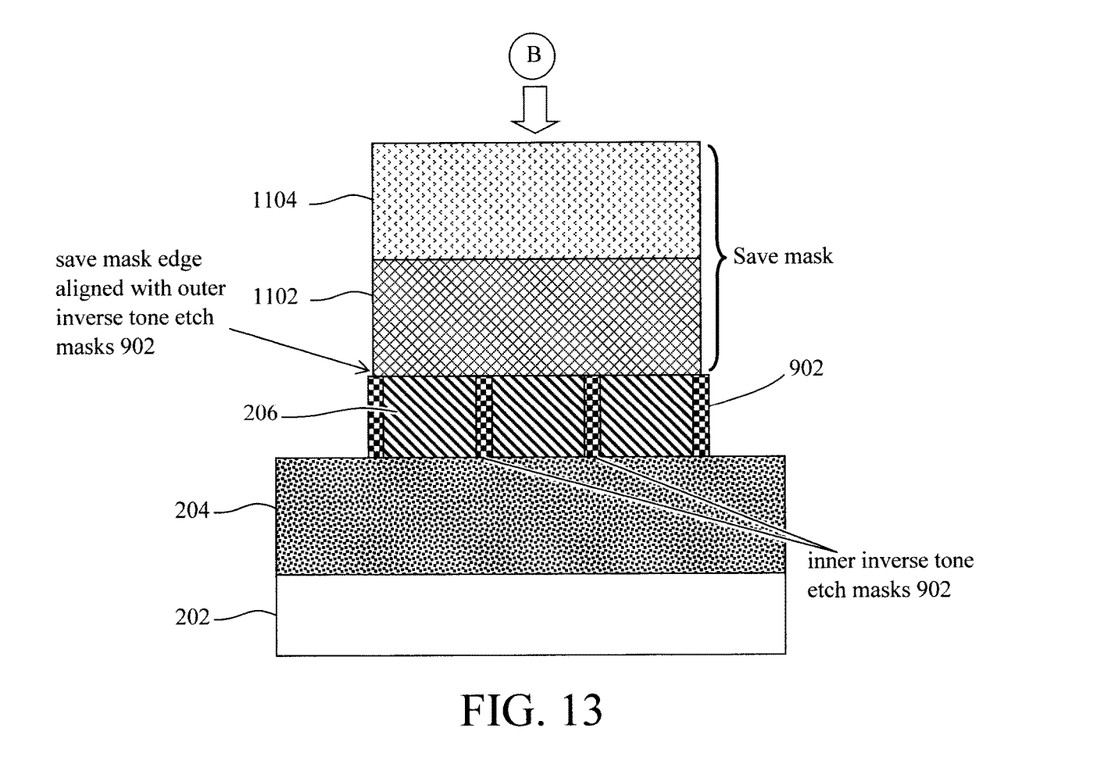
FIG. 13 is a cross-sectional diagram illustrating the patterned resist having been used to pattern the lithography stack to define a save mask over the tone invert layer with opposite ends that align with the outer inverse tone etch masks, and the save mask having been used to pattern the tone invert layer according to an embodiment of the present invention.

The patterned resist 1104 is then used to pattern the lithography stack 1102 to define the save mask over the tone invert layer 206/inverse tone etch masks 902. See FIG. 13. Notably, as shown in FIG. 13, opposite ends of the save mask align with the outer inverse tone etch masks 902. While it is difficult to align the ends of the save mask precisely with the edges of the outer inverse tone etch masks 902, it is not necessary to do so, as long as the ends of the save mask align with the tops of the outer inverse tone etch masks 902 which have a wide-enough width to land on. This width is within the alignment and overlay tolerances of state of the art lithography tools. Further, it is notable that, even if the ends of the save mask and the outer inverse tone etch masks 902 misalign due to alignment and overlay errors in the save lithography process, they are still far enough away from the (inner) fins of interest. Any slivers formed because of potential misalignment will still be removed by the isotropic etch.

Figure 14:
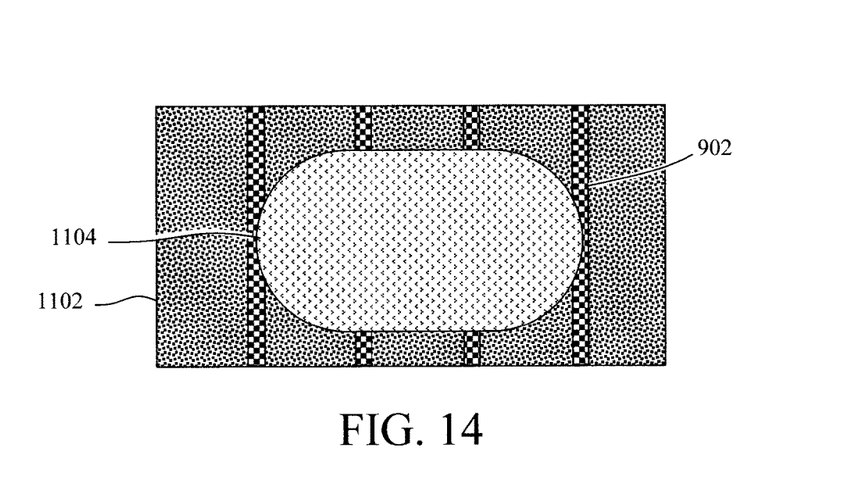
FIG. 14 is a top-down diagram illustrating removal of the exposed tone invert layer selective to the inverse tone etch masks according to an embodiment of the present invention.

Next, as shown in FIG. 13, the save mask is then used to pattern the tone invert layer 206. According to an exemplary embodiment, an anisotropic (directional) etching process such as reactive ion etching (RIE) is used in this step to remove the exposed/unmasked portions of the tone invert layer 206, exposing the outer inverse tone etch masks 902. As provided above, there is etch selectivity between the inverse tone etch masks 902 and the tone invert layer 206. As such, the outer inverse tone etch masks 902 remain in place following RIE of the tone invert layer 206. See FIG. 13. See also FIG. 14 which provides a top-down view (e.g., from viewpoint B—see FIG. 13) which illustrates removal of the exposed tone invert layer 206 selective to the inverse tone etch masks 902. Tone invert layer 206, however, remains surrounding the inverse tone etch masks 902 beneath the save mask.

Figure 15:
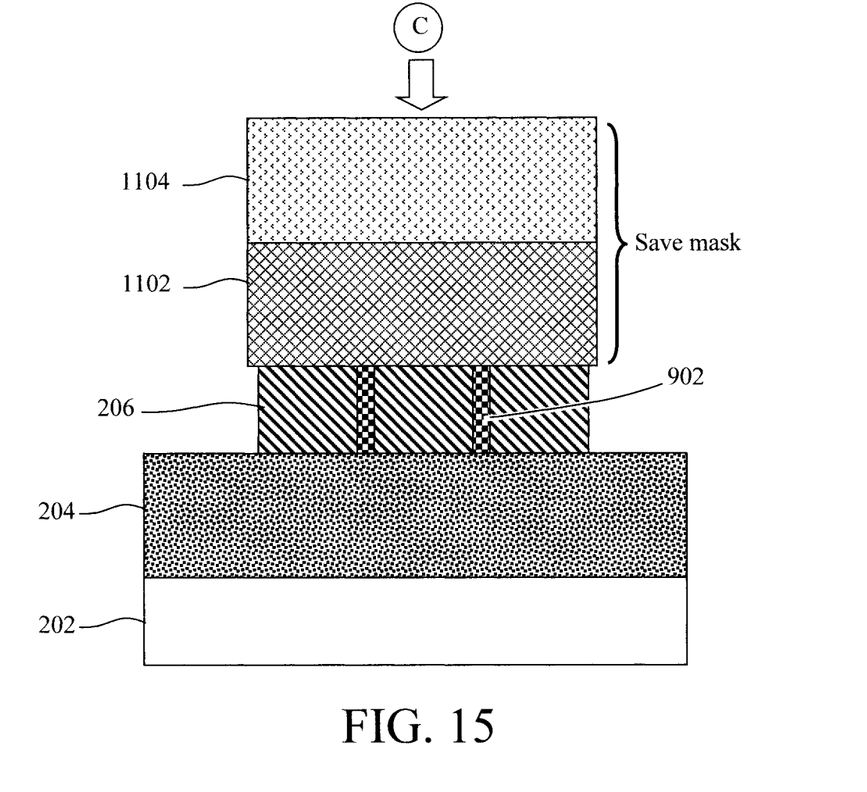
FIG. 15 is a cross-sectional diagram illustrating an isotropic etch having been used to remove the outer inverse tone etch masks according to an embodiment of the present invention.
Figure 16:
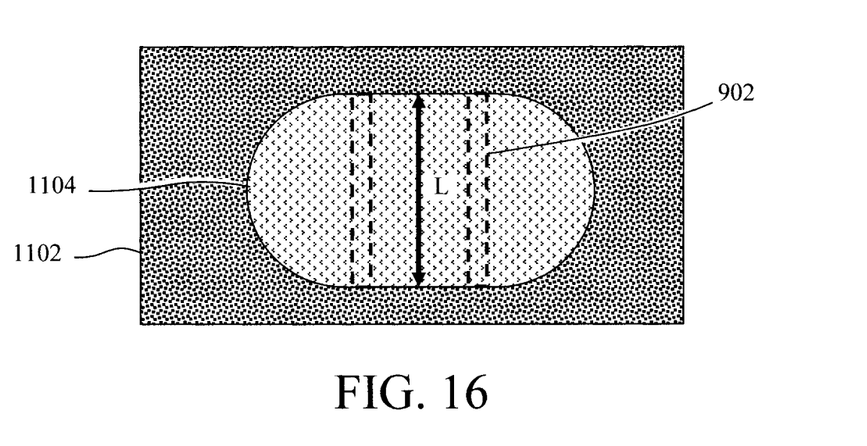
FIG. 16 is a top-down diagram illustrating the inverse tone etch masks outside of the save mask having been removed according to an embodiment of the present invention.

An isotropic (non-directional) etch such as a wet etch is then used to remove the outer inverse tone etch masks 902. See FIG. 15. Since there is etch selectivity between the inverse tone etch masks 902 and the tone invert layer 206, the inner inverse tone etch masks 902 are protected from the isotropic etch by the tone invert layer 206. See also FIG. 16 which provides a top-down view (e.g., from viewpoint C—see FIG. 16) which illustrates the inverse tone etch masks 902 outside of the save mask having been removed. As highlighted above, this is the etch that defines the fin length. Advantageously, since the outer inverse tone etch masks 902 have been removed, the inner inverse tone etch masks 902 present under the save mask (shown with dashed lines) all have a uniform length L.

Figure 17:
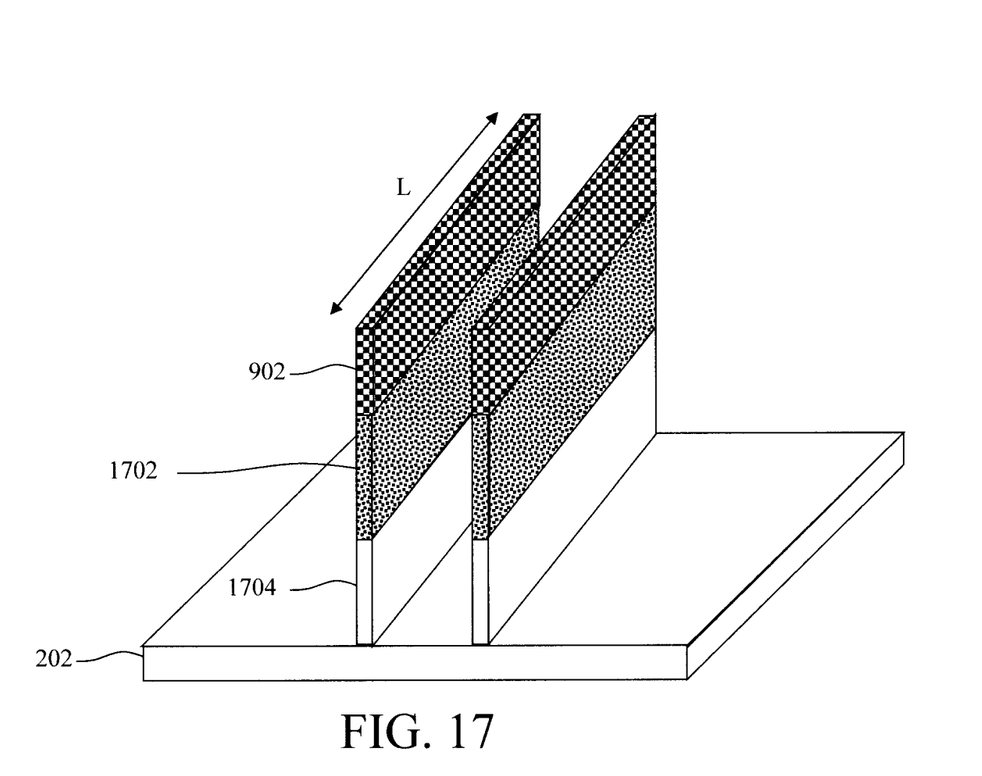
FIG. 17 is a three-dimensional diagram illustrating the inverse tone etch masks having been used to pattern the hardmask into a plurality of individual fin hardmasks, and the fin hardmasks having been used to pattern fins in the wafer according to an embodiment of the present invention.

Thus, after removal of the save mask (patterned resist 1102 and lithography stack 1104) and remaining tone invert layer 206, inverse tone etch masks 902 of a uniform length L are achieved. See FIG. 17 (which provides a three-dimensional view). As provided above, there is etch selectivity between the inverse tone etch masks 902 and the hardmask 204. Accordingly, the inverse tone etch masks 902 are then used to pattern the hardmask 204 into a plurality of individual fin hardmasks 1702. A directional etching process such as RIE can be used for the fin hardmask etch. The fin hardmasks 1702 are then in turn used to pattern fins 1704 in the wafer 202. Again, a directional etching process such as RIE can be used for the fin etch. Based on the uniform length L of the inverse tone etch masks 902, the fins 1704 too will have a uniform length.

Fins 1704 fabricated by the above-described process can be used for a variety of different, non-limiting applications. For instance, fins 1704 can serve as the fin channels in lateral fin field-effect transistor (FET) finFET devices, vertical FET devices, etc. For illustrative purposes only, FIG. 18 illustrates an exemplary finFET device 1800 that may be formed in accordance with the present techniques.

Figure 18:
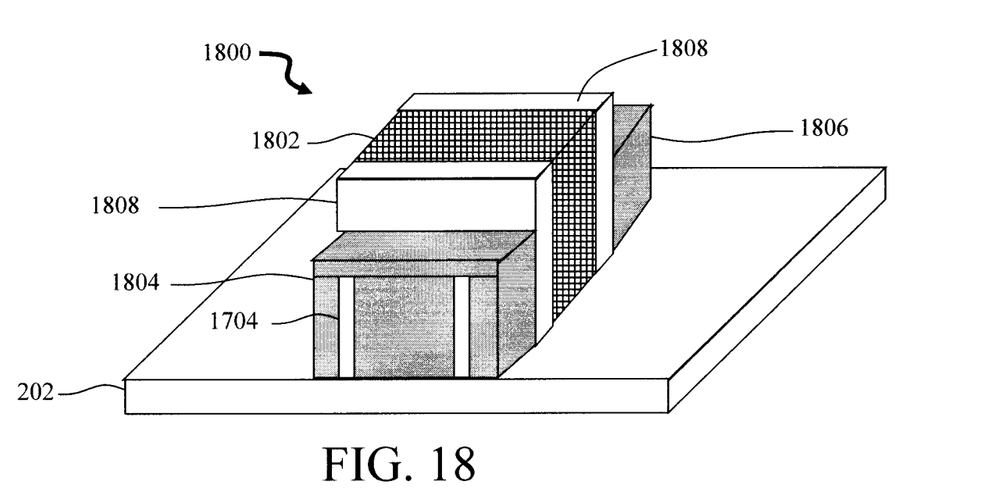
FIG. 18 is a three-dimensional diagram illustrating an exemplary finFET device according to an embodiment of the present invention.

As shown in FIG. 18, finFET device 1800 includes a gate 1802 over the fins 1704 (i.e., gate 1802 is present over portions of the fins 1704 that serve as a channel region of finFET device 1800). Source and drains 1804 and 1806 are present over portions of the fins 1704 extending out from under the gate the gate 1802. Spacers 1808 offset the gate 1802 from the source and drains 1804 and 1806. Advantageously, based on the above-described process, the fins 1704 have a uniform length, thereby unifying device performance from fin-to-fin. By 'uniform', it is meant that the length of the fins 1704 varies by less than about 2% from fin-to-fin. Further, as provided above, the present techniques advantageously permit the tuning of the width of the fins by adjusting the width of the trenches 602 patterned in the tone invert layer 206, i.e., from W to W', see above. For instance, as described above, the tone invert layer 206 can be printed (lithographically) at the smallest possible space at a given pitch. The width can then be further reduced, as desired, using additional tone invert material 702. Thus, a variety of fin dimensions can be achieved, even those at a sub-lithographic scale.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of patterning fins in a wafer, the method comprising the steps of:
    depositing a hardmask on the wafer;
    depositing a tone invert layer on the hardmask;
    patterning trenches in the tone invert layer;
    forming inverse tone etch masks on the hardmask within the trenches patterned in the tone invert layer, wherein the inverse tone etch masks comprise inner inverse tone etch masks between two outer inverse tone etch masks;
    forming a save mask on the tone invert layer with opposite ends of the save mask being aligned with the outer inverse tone etch masks;
    using the save mask to selectively remove unmasked portions of the tone invert layer to expose the outer inverse tone etch masks;
    removing the outer inverse tone etch masks, wherein the inner inverse tone etch masks that remain have a uniform length L;
    patterning the hardmask into a plurality of individual fin hardmasks using the inner inverse tone etch masks; and
    patterning a plurality of fins in the wafer using the plurality of individual fin hardmasks.

2. The method of claim 1, wherein the hardmask comprises a nitride hardmask material selected from the group consisting of: silicon nitride (SiN), silicon oxycarbonitride (SiOCN), and combinations thereof.

3. The method of claim 1, wherein the hardmask comprises amorphous silicon disposed on a nitride hardmask material.

4. The method of claim 1, wherein the tone invert layer comprises a material selected from the group consisting of: $SiO_2$, SiOC, and combinations thereof.

5. The method of claim 1, wherein the trenches patterned in the tone invert layer have a width W, the method comprising the step of:
    reducing the width W to a width W', wherein W>W'.

6. The method of claim 5, wherein W is from about 10 nm to about 20 nm and ranges therebetween, and wherein W' is from about 2 nm to about 15 nm and ranges therebetween.

7. The method of claim 5, further comprising the step of:
    depositing additional tone invert material onto the tone invert layer including along sidewalls of the trenches to reduce the width W to the width W'.

8. The method of claim 7, wherein the additional tone invert material comprises a same material as the tone invert layer.

9. The method of claim 7, wherein the additional tone invert material is deposited using a process selective for deposition of the additional tone invert material on the tone invert layer rather than on the hardmask.

10. The method of claim 7, further comprising the step of:
    etching back the additional tone invert material to expose the hardmask at bottoms of the trenches.

11. The method of claim 1, wherein the inverse tone etch masks comprise a nitride material selected from the group consisting of: SiN, SiOCN, and combinations thereof.

12. The method of claim 1, wherein the inverse tone etch masks comprise a metal oxide selected from the group consisting of: titanium dioxide ($TiO_2$), ruthenium oxide ($RuO_2$), and combinations thereof.

13. The method of claim 1, further comprising the step of:
    growing the inverse tone etch masks up from the hardmask exposed at bottoms of the trenches.

14. The method of claim 1, further comprising the steps of:
    treating a surface of the hardmask prior to depositing the tone invert layer on the hardmask; and
    depositing the inverse tone etch masks into the trenches using area-selective deposition on the treated surface of the hardmask.

15. The method of claim 1, wherein the step of forming the save mask comprises the steps of:
    depositing a lithography stack on the tone invert layer;
    forming a patterned resist on the lithography stack with a footprint and a location of the save mask; and
    patterning the lithography stack using the patterned resist.

16. The method of claim 15, wherein the patterned resist has rounded corners.

17. The method of claim 1, wherein the outer inverse tone etch masks are removed using an isotropic etching process.

* * * * *